(12) United States Patent
Harris et al.

(10) Patent No.: US 7,075,167 B2
(45) Date of Patent: Jul. 11, 2006

(54) SPIRAL INDUCTOR FORMED IN A SEMICONDUCTOR SUBSTRATE

(75) Inventors: Edward B. Harris, Orlando, FL (US); Stephen W. Downey, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 74 days.

(21) Appl. No.: 10/646,997

(22) Filed: Aug. 22, 2003

(65) Prior Publication Data

US 2005/0040471 A1 Feb. 24, 2005

(51) Int. Cl.
*H01L 29/00* (2006.01)
*H01L 29/76* (2006.01)
*H01L 27/11* (2006.01)

(52) U.S. Cl. .................. 257/531; 257/379; 257/904

(58) Field of Classification Search ............... 257/531, 257/516

See application file for complete search history.

(56) References Cited

U.S. PATENT DOCUMENTS

| | | | |
|---|---|---|---|
| 5,227,659 A | 7/1993 | Hubbard | |
| 5,446,311 A | 8/1995 | Ewen et al. | |
| 5,736,749 A | 4/1998 | Xie | |
| 5,788,854 A | 8/1998 | Desaigoudar et al. | |
| 6,057,202 A | 5/2000 | Chen et al. | |
| 6,083,802 A | 7/2000 | Wen et al. | |
| 6,140,197 A | 10/2000 | Chu et al. | |
| 6,153,489 A * | 11/2000 | Park et al. | 438/381 |
| 6,160,303 A | 12/2000 | Fattaruso | |
| 6,211,056 B1 | 4/2001 | Begley et al. | |
| 6,249,191 B1 | 6/2001 | Forbes | |
| 6,420,773 B1 | 7/2002 | Liou | |
| 6,429,504 B1 * | 8/2002 | Beaussart et al. | 257/531 |
| 6,503,838 B1 * | 1/2003 | Swanson | 438/692 |
| 6,534,843 B1 | 3/2003 | Acosta et al. | |

FOREIGN PATENT DOCUMENTS

| EP | 1 143 517 A2 | 10/2001 |
|---|---|---|
| JP | 11-354330 A | 12/1999 |

* cited by examiner

*Primary Examiner*—Zandra V. Smith
*Assistant Examiner*—Kiesha Rose

(57) ABSTRACT

An inductor formed on a semiconductor substrate, comprising active device regions. The inductor comprises conductive lines formed on a dielectric layer overlying the semiconductor substrate. The conductive lines are patterned and etched into the desired shape, in one embodiment a planar spiral. A region of the substrate below the inductor are removed to lower the inductive Q factor.

19 Claims, 12 Drawing Sheets

SPIRAL INDUCTOR FORMED IN A SEMICONDUCTOR SUBSTRATE

FIELD OF THE INVENTION

This invention relates generally to inductors, and more specifically, to spiral inductors formed in a semiconductor substrate.

BACKGROUND OF THE INVENTION

The current revolution in wireless communications and the need for smaller wireless communications devices has spawned significant efforts directed to the optimization and miniaturization of radio communications electronic devices. Passive components (such as inductors, capacitors and transformers), play a necessary role in the operation of these devices and thus efforts are directed toward reducing the size and improving the performance and fabrication efficiency of such passive components.

Discrete inductors and capacitors are electromagnetic components employed in alternating current and radio frequency applications, such as oscillators, amplifiers and signal filters, to provide frequency dependent effects. Specifically, the voltage across the inductor is a function of the product of the inductance and the time derivative of the current through the inductor. A conventional inductor comprises a plurality of windings enclosing a core constructed of a ferromagnetic or an insulating material. Although an inductor core is not required, use of a ferromagnetic core, for example, increases the inductance value. The inductance is also a function of the number of coil turns (specifically, the inductance is proportional to the square of the number of turns) and the core area. Conventional discrete inductors are formed as a helix (also referred to as a solenoidal shape) or a torroid. The core is typically formed of iron, cobalt or nickel (or a ferromagnetic alloy) comprising a plurality of magnetic domains. The current supplied to the inductor induces a magnetic field in the core material, causing domain alignment and a resulting increase in the material permeability, which in turn increases the inductance.

Developments in the semiconductor industry have over the years been directed at fabricating higher performance devices of decreasing size. One challenge of semiconductor circuit design and fabrication is the integration of high performance capacitors and inductors into the semiconductor device. Ideally, these components are formed on a relatively small surface area of a semiconductor substrate, using methods and procedures that are conventional in the semiconductor fabrication art. However, compared with the feature sizes and line widths of active devices, inductors and capacitors are large and not easily integrated into semiconductor devices that typically have feature sizes in the sub-micron range.

Most inductors formed on a semiconductor substrate surface have a spiral shape, where the plane of the spiral is parallel to the substrate surface. Many techniques are known for forming the spiral inductor, such as by masking, patterning and etching a layer of conductive material formed on the substrate surface. Multiple interconnected spiral inductors can also be formed to provide the desired inductive properties and/or to simplify the fabrication process. See for example, U.S. Pat. No. 6,429,504 describing a multi-layer spiral inductor and Number 5610433 disclosing a high value inductor with a high Q factor formed from a plurality of layers with each layer comprising two or more coils. The coils in the various layers are interconnected in series.

The Q (or quality factor), an important inductor figure of merit, is defined as the ratio of inductive reactance to resistance. High-Q inductors (e.g., having a low resistance) present a narrow Q peak as a function of the input signal frequency, where the peak occurs at the inductor resonant frequency. High-Q inductors are especially important for use in frequency-dependent circuits operating with narrow bandwidths. For example, increasing the Q for an inductor operating in an oscillator decreases the oscillator phase noise, and confines the oscillator frequency to a narrower band of frequencies. Because the Q value is an inverse function of inductor resistance, minimizing the resistance increases the Q. One known technique for minimizing the resistance increases the cross-sectional area of the conductive material forming the inductor. However, such conductors can present difficulties during the etching, cleaning, and passivating steps, and consume valuable space on the semiconductor substrate. Also, difficulties arise when gaps form in the dielectric material between the metal conductors, creating device reliability problems, as the gaps can promote local dielectric breakdown and consequent shorting of the inductor turns.

The magnetic field of a spiral inductor formed on the surface of a semiconductor substrate is perpendicular to the substrate. The field induces eddy currents within the semiconductor substrate and the conductive interconnect structures formed in the substrate to connect active semiconductor regions. Since these eddy currents represent a loss mechanism, they increase the inductor resistance and thus lower the inductor Q factor. To avoid such losses, at relatively low operational frequencies the inductive effect can be achieved by simulating an inductor with active devices. But active devices have a finite dynamic range, can inject unwanted noise into the operating circuits and cannot provide acceptable inductive effects at higher operational frequencies.

One known technique for limiting eddy current losses places a conductive shield parallel to and underlying the inductor. The conductor shorts the magnetic field lines, reducing the eddy currents in the underlying semiconductor substrate material. Eddy currents can also be reduced by using deep trench technology to remove a region of silicon below the inductor. This technique, which can be used to form isolation regions in an integrated circuit comprising both bipolar and CMOS transistors (complementary metal-oxide silicon field effect transistors), removes the silicon from the front or top surface of the wafer. Increasing the distance between the inductor and the underlying silicon also lowers the eddy current losses. Marginal improvement in the Q factor have been noted when these techniques are employed.

BRIEF SUMMARY OF THE INVENTION

To provide further advances in the fabrication of inductors in conjunction with active devices on a semiconductor substrate, an architecture and processes are provided for forming such an inductor comprising a semiconductor substrate and a dielectric layer overlying the substrate. Conductive lines, comprising the inductor, are formed on an upper surface of the dielectric layer. A region of the semiconductor substrate under the conductive lines is removed.

A semiconductor device comprises a semiconductor substrate and a dielectric layer overlying the semiconductor substrate. A continuous conductor is disposed on the dielectric layer. The semiconductor substrate defines an aperture therein in at least a portion of a region underlying the continuous conductor.

BRIEF DESCRIPTION OF THE DRAWINGS

The present invention can be more easily understood and the advantages and uses thereof more readily apparent, when considered in view of the following detailed description of when read in conjunction with the following figures wherein.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Figure 1:
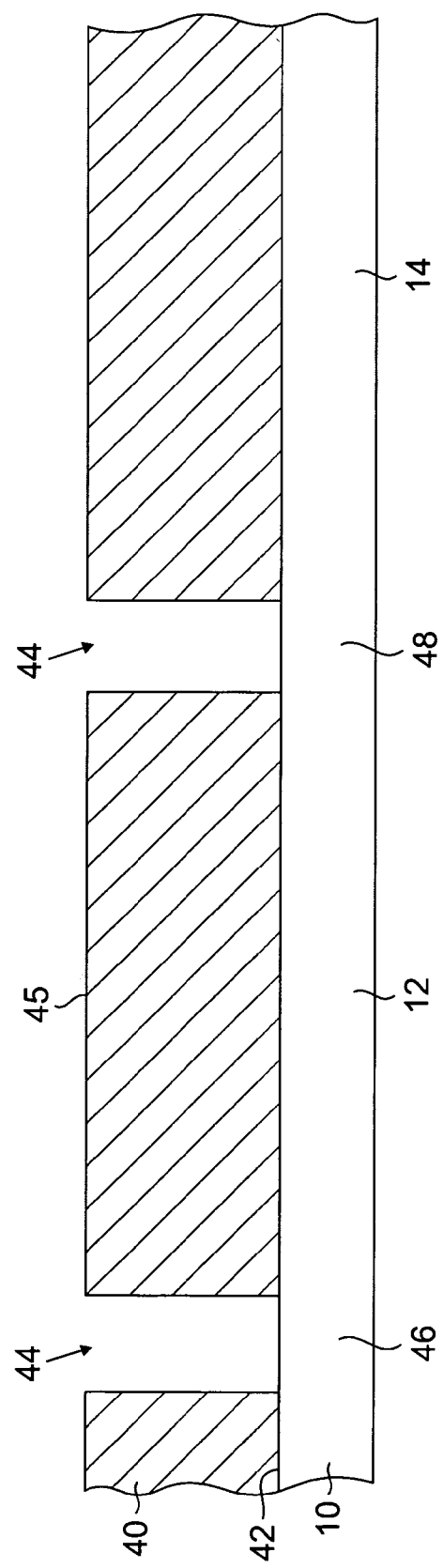
FIGS. 1–14 illustrate a semiconductor structure and inductor following the completion of various process steps according to the invention.

One process for forming an inductor according to the present invention begins as shown in FIG. 1, illustrating an integrated circuit semiconductor substrate 10, which conventionally includes a plurality of active elements (not shown). According to one embodiment of the present invention, to accommodate the inductor no active elements are formed within regions 12 and 14.

A dielectric layer 40 (typically 3–5 microns thick) is formed over an upper surface 42 of the silicon substrate 10, followed by formation of windows 44 extending through the dielectric layer 40 to active elements in regions 46 and 48 of the substrate 10. The windows 44 are formed using known photolithographic masking, patterning and etching processes. In subsequent processing steps a conductive material layer is formed overlying an upper surface 45. In the region of the silicon substrate illustrated in FIG. 1 an inductor is formed in the conductive material layer, and interconnecting elements (e.g., tungsten plugs) are formed in the windows 44 for connecting the inductor to the active elements in the regions 46 and 48.

Figure 2:
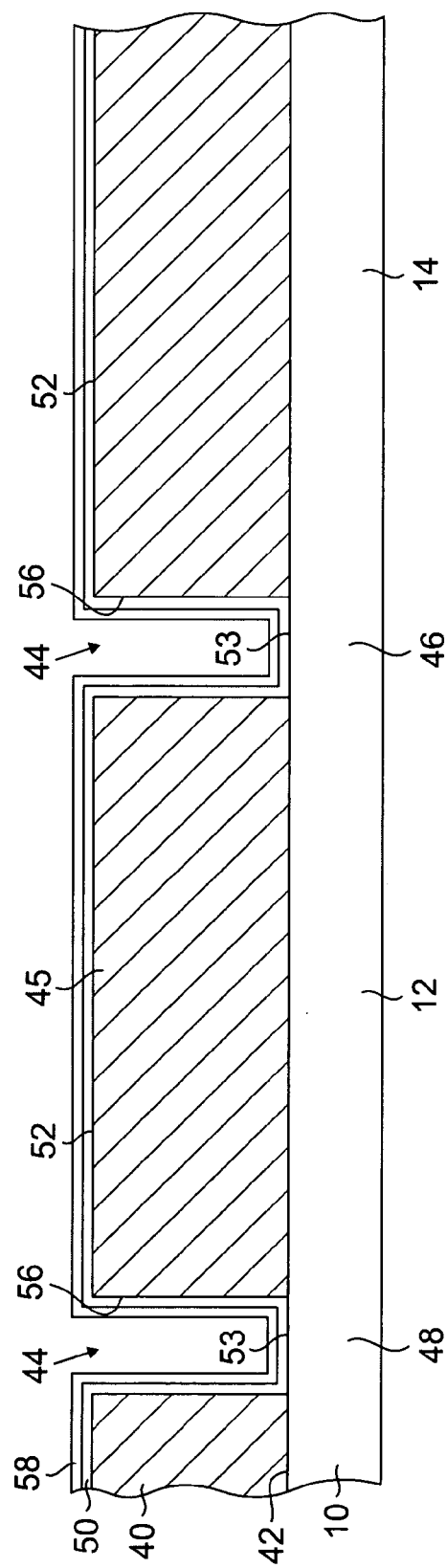

As illustrated in FIG. 2, a titanium layer 50 is deposited in the windows 44 and on a field region 52, i.e., an upper surface of the dielectric layer 40. At a bottom surface 53 of the windows 44, the titanium layer 50 reacts with the underlying silicon of the active regions to form a localized titanium silicide region. This silicide region provides improved conductivity between the active regions and the interconnecting tungsten plugs formed later in the windows 44.

Next a titanium-nitride (TiN) layer 58 is deposited within the windows 44 and on the field region 52. It is known that titanium-nitride can delaminate from oxide-based materials such as the dielectric layer 40. The titanium layer 50 serves as an adhesion layer to promote bonding between the titanium-nitride layer 58 and the underlying dielectric material of the field region 52, sidewalls 56 and bottom surfaces 53. The TiN layer 58 serves as a barrier between the underlying titanium layer and the fluorine-based gas used during the tungsten deposition step described below, as the fluorine-based gas is highly reactive with titanium.

Figure 3:
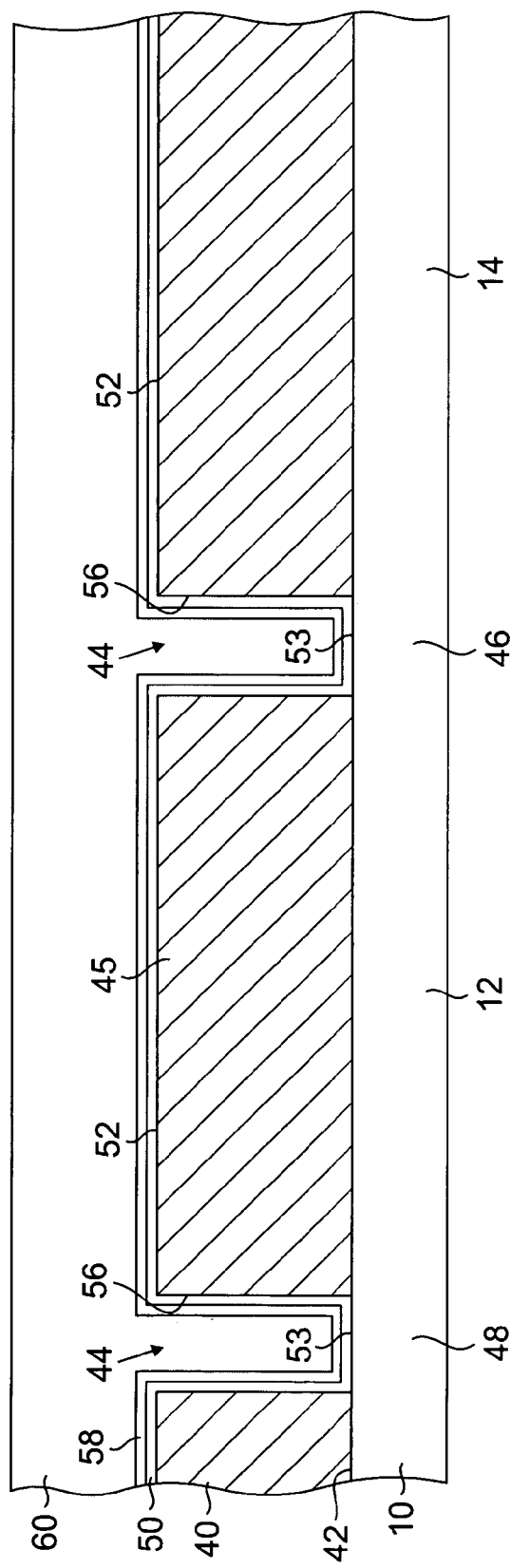
Figure 4:
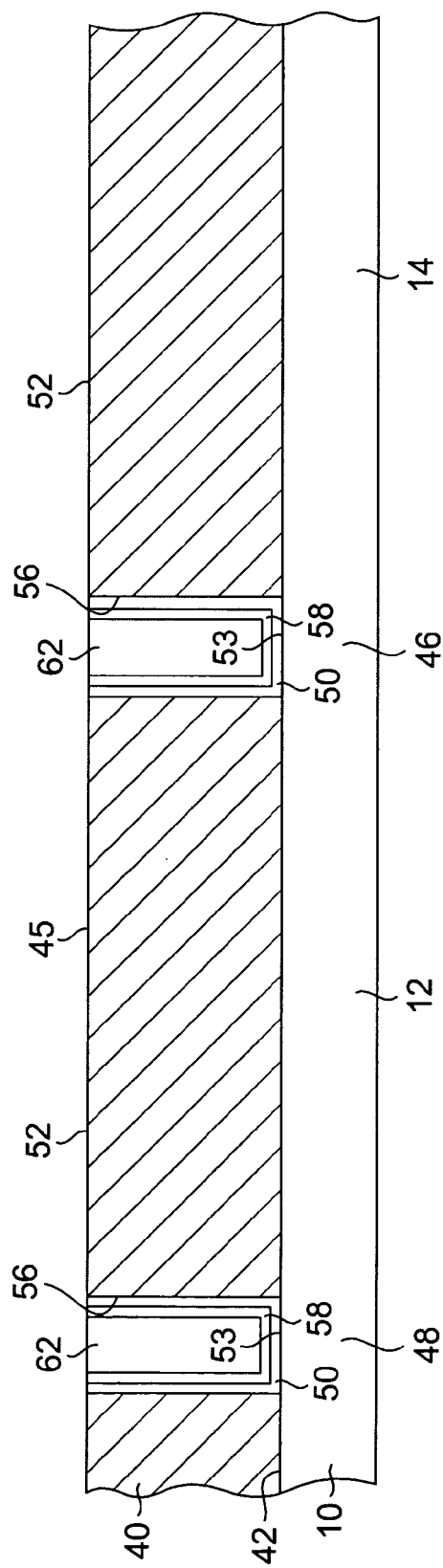

As shown in FIG. 3, a tungsten layer 60 is formed in the windows 44 and in the field region 52 by a chemical vapor deposition process involving tungsten hexafluoride ($WF_6$) and silane ($SiH_4$). The silicon substrate 10 then undergoes a chemical-mechanical polishing step, forming tungsten plugs 62. See FIG. 4.

Figure 5:
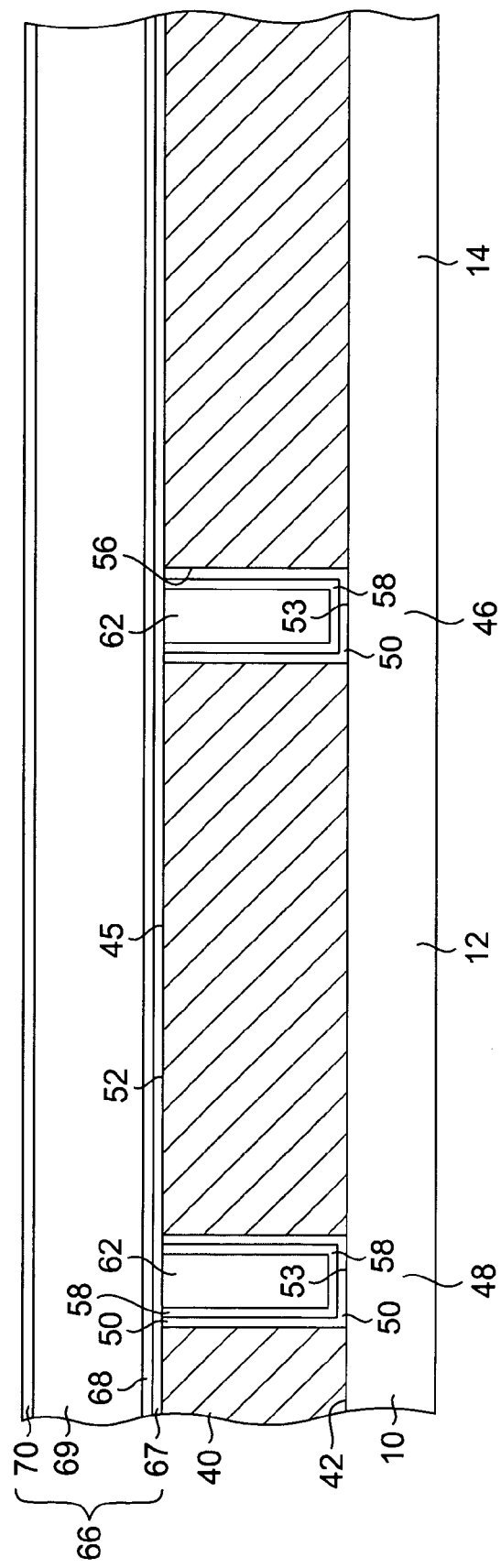

As illustrated in FIG. 5, an aluminum stack 66 comprising, from bottom to top, a titanium layer 67, a titanium nitride layer 68, an aluminum layer 69 and an anti-reflective cap layer 70, is deposited over the field region 52. The titanium layer 67 and the titanium-nitride layer 68 of the aluminum stack 66 serve the same purposes as the titanium and titanium nitride layers 50 and 58 described above.

Figure 6:
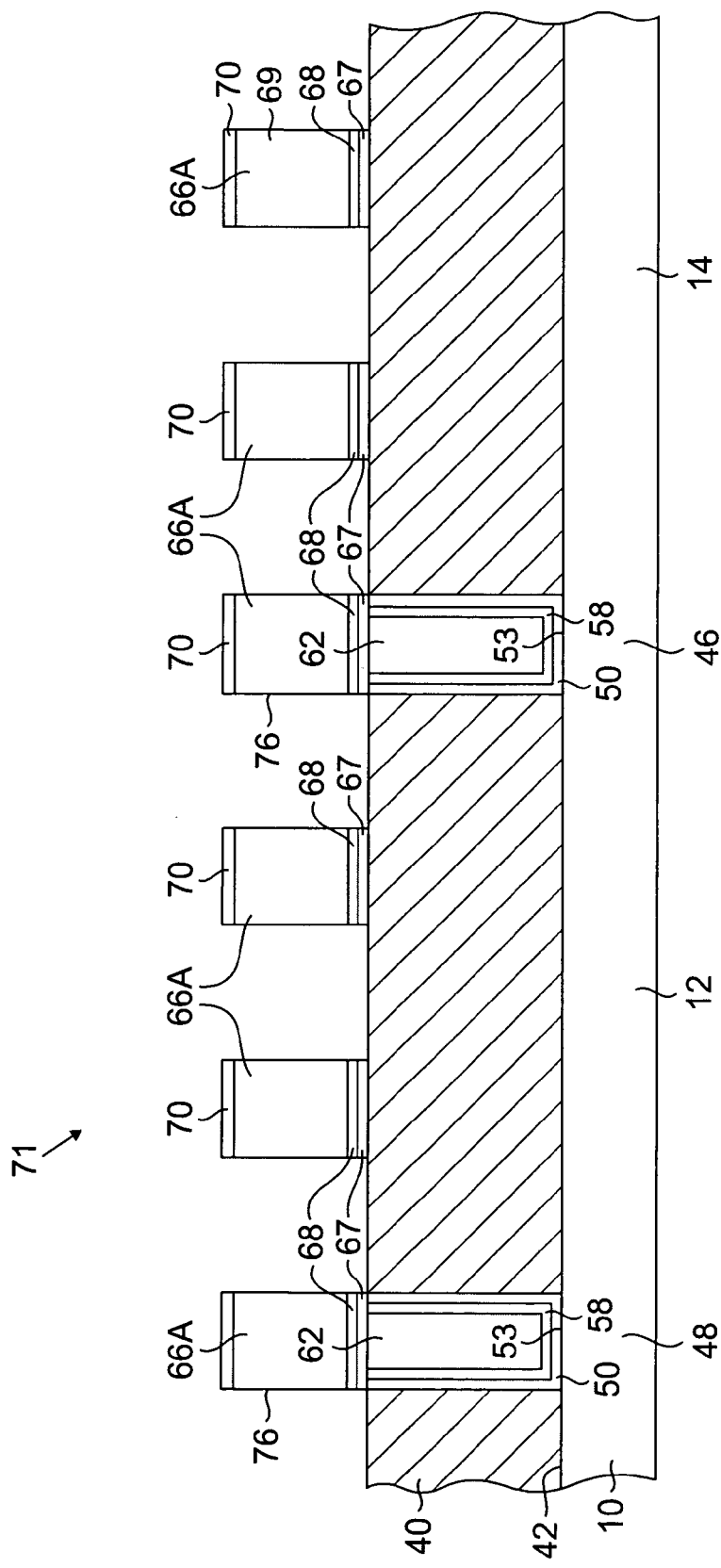

Certain regions of the aluminum stack 66 are removed using conventional masking, patterning and etching steps, to form, in one region of the substrate 10, the desired conductor shape for an inductor 71, comprising a plurality of aluminum conductive lines 66A as shown in FIG. 6.

In other regions of the substrate 10 not shown in FIG. 6, conductive interconnect structures are formed in the aluminum stack 66 by masking, patterning and etching steps, and underlying conductive tungsten plugs are formed in contact with active regions in the substrate 10. The interconnect structures, referred to as a metal-1 layer or first metallization layer, connect to the underlying tungsten plugs. As is known to those skilled in the art, additional interconnect structures, conductive vias and intermetallic dielectric layers are formed overlying the aluminum stack 66 to form a complete interconnect system for the integrated circuit. Thus formation of the inductor 71 is conveniently integrated into the process for forming device interconnects, as the inductor can be formed simultaneously with formation of the interconnect structures.

Figure 7:
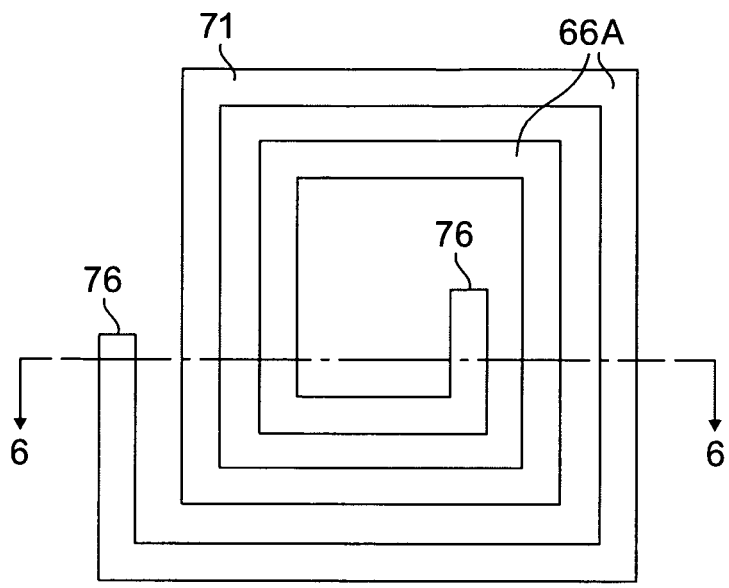

As can be seen from the plan view of FIG. 7 (FIG. 6 is a cross-sectional view take along the lines 6—6 of FIG. 7), in this embodiment the conductive lines 66A are linear and intersect at about a 90° angle, forming a linear spiral-shaped inductor 71. Terminal ends 76 of the inductor 71 may be connected to underlying active devices in the regions 46 and 48 by the tungsten plugs 62.

Figure 8:
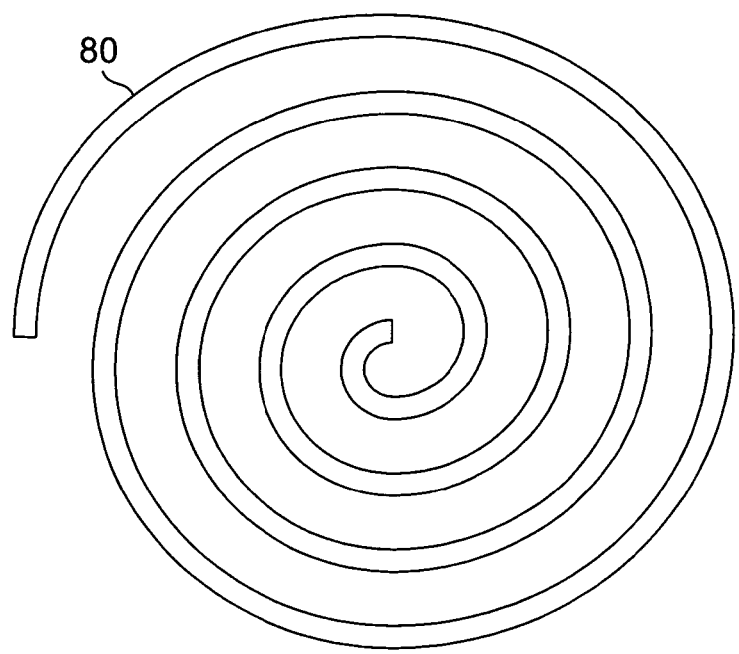

A curved spiral inductor 80 as shown in FIG. 8 can also be formed by appropriate masking, patterning and etching of material regions of the aluminum stack 66. An inductor having a desired inductance value can be formed by appropriate selection of the size and geometrical pattern of the conductors forming the inductor 71.

In the embodiment of the present invention illustrated in FIG. 6, the inductor 71 is formed in a metal-1 layer or a first metallization layer. In other embodiments illustrated below, the inductor is formed in upper level metallization layers.

Figure 9:
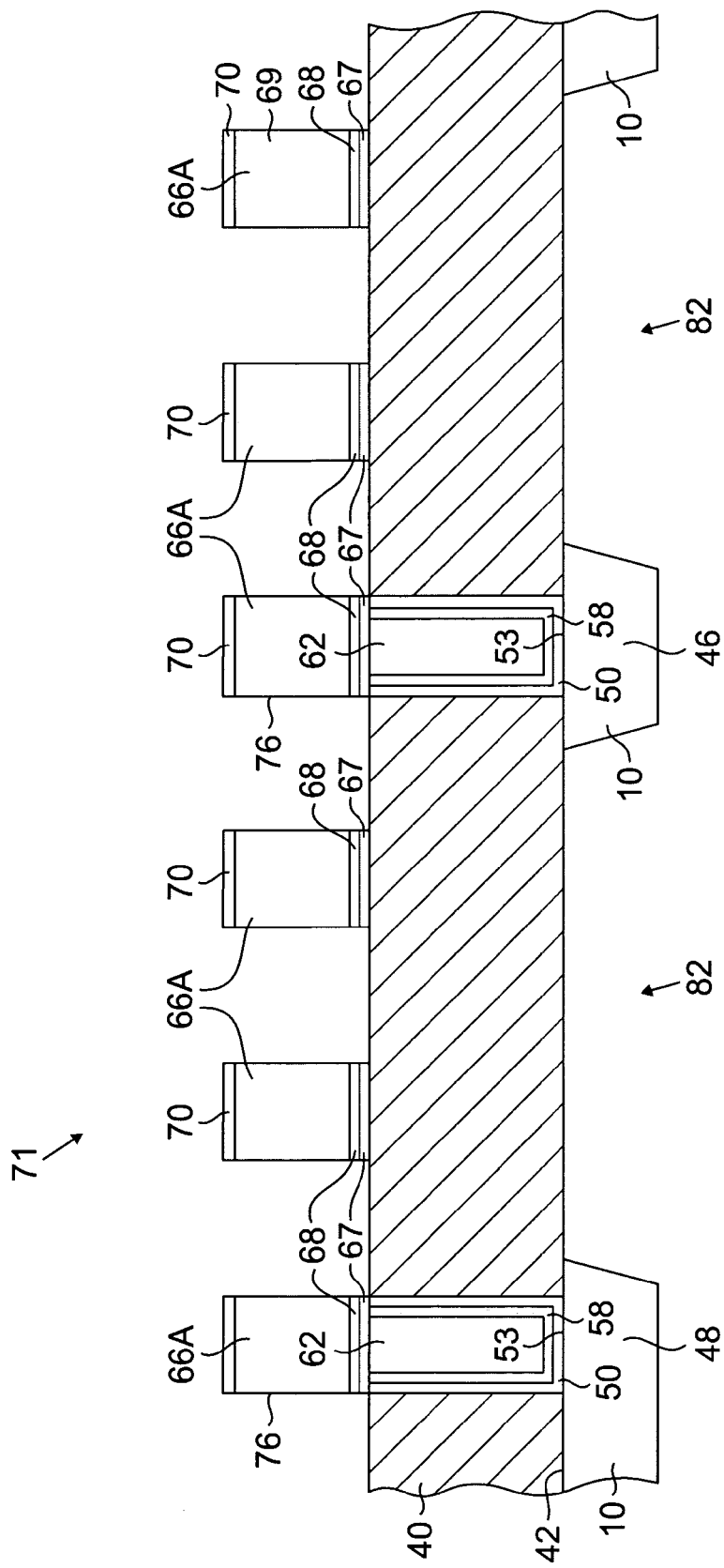
Figure 10:
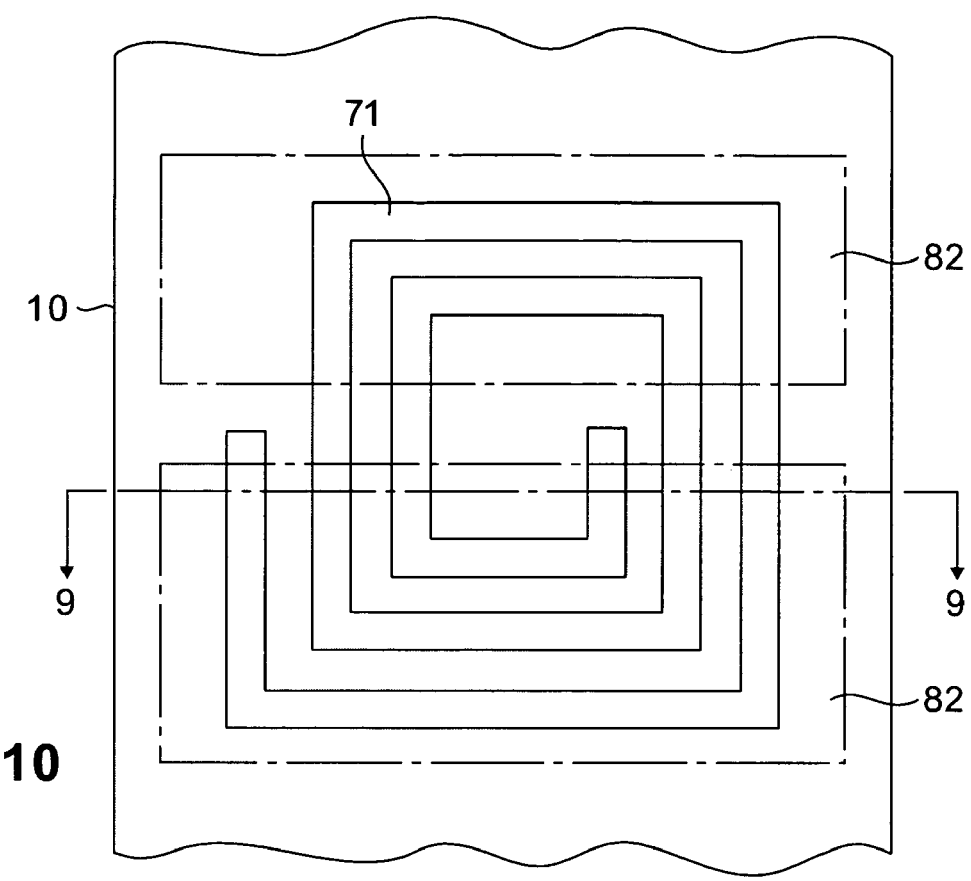

According to the present invention the regions 12 and 14 of the substrate 10 underlying the inductor 71 (referred to as the backside of the wafer) are removed after formation of the inductor 71, forming voids 82. The resulting structure is illustrated in the cross-sectional view of FIG. 9 and the plan view of FIG. 10. Material etching processes or laser micromachining are known techniques that can be employed to remove the regions 12 and 14, which are typically about 300–500 microns thick. Although the voids 82 have a rectangular shape in FIG. 10, this is merely exemplary. The void for a circular spiral inductor, for example, would typically be circular. In one embodiment the voids 82 are filled with a non-conductive, dielectric or packaging material such as epoxy or polyimide. In another embodiment the voids 82 are formed in the substrate 10 prior to formation of the inductor 71, although such a technique may be more difficult as it may be necessary to fill the void with a dielectric material, such as silicon dioxide, to allow subsequent formation of overlying layers.

As discussed above, the absence of semiconductor and conductive material below the inductor 71 lowers inductor-induced eddy currents and raises the inductor Q factor.

Figure 11:
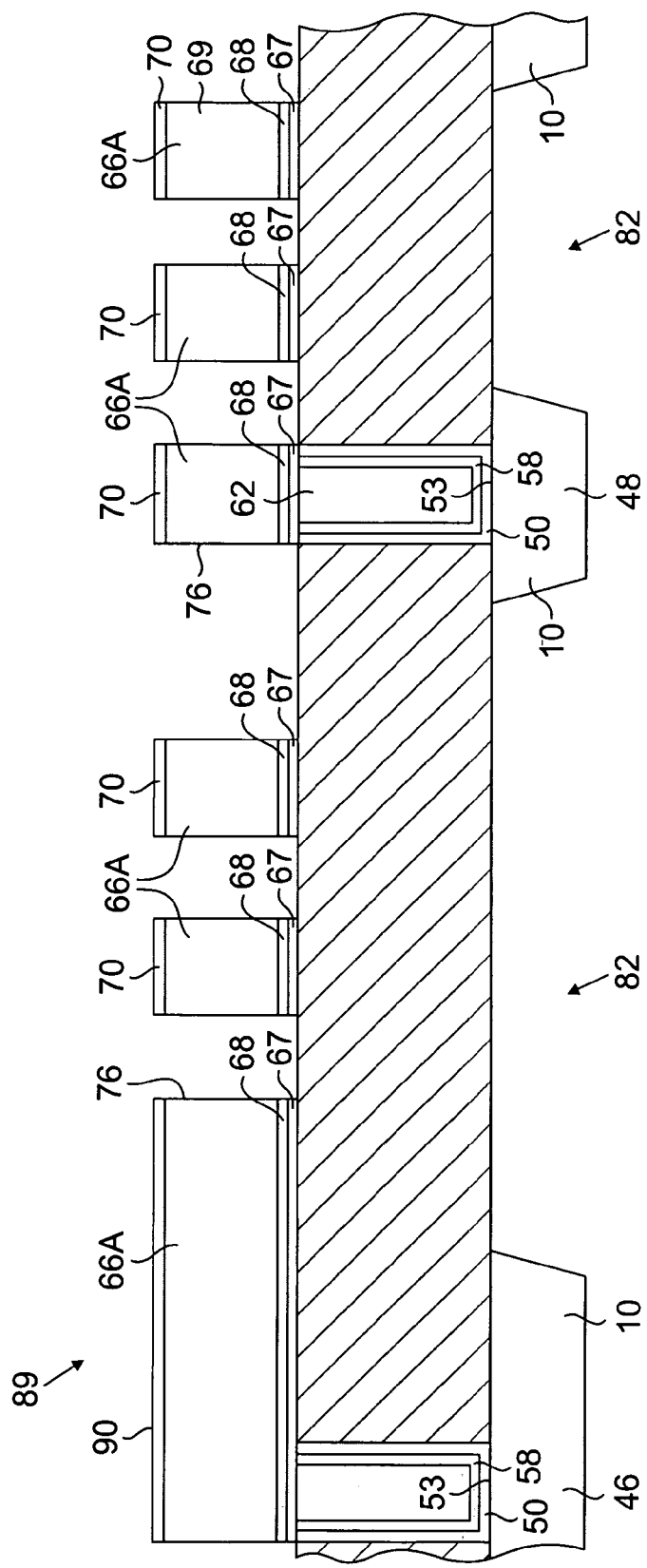

FIG. 11 illustrates an embodiment of an inductor 89 comprising a conductive element 90 in the same metallization layer as the conductive lines 66A, for extending the terminal end 76. In this embodiment the void 82 is larger than in the embodiment of FIG. 9, thus increasing the Q factor of the inductor 89, when compared with the inductor 71 of FIG. 9.

Figure 12:
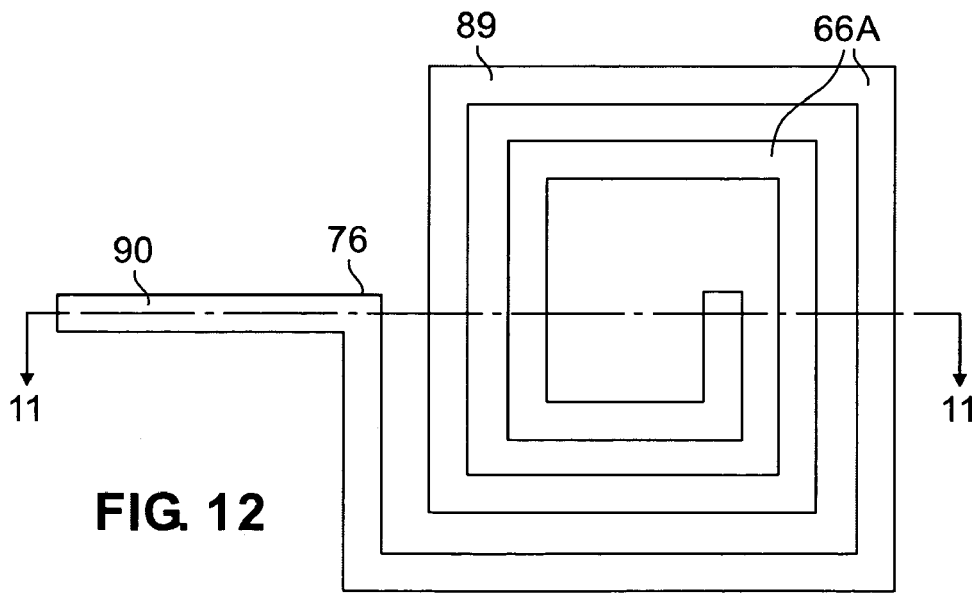

FIG. 12 is a plan view of the inductor 89 of FIG. 11, with the cross-sectional view of FIG. 11 taken along the plane 11—11 of FIG. 12.

Figure 13:
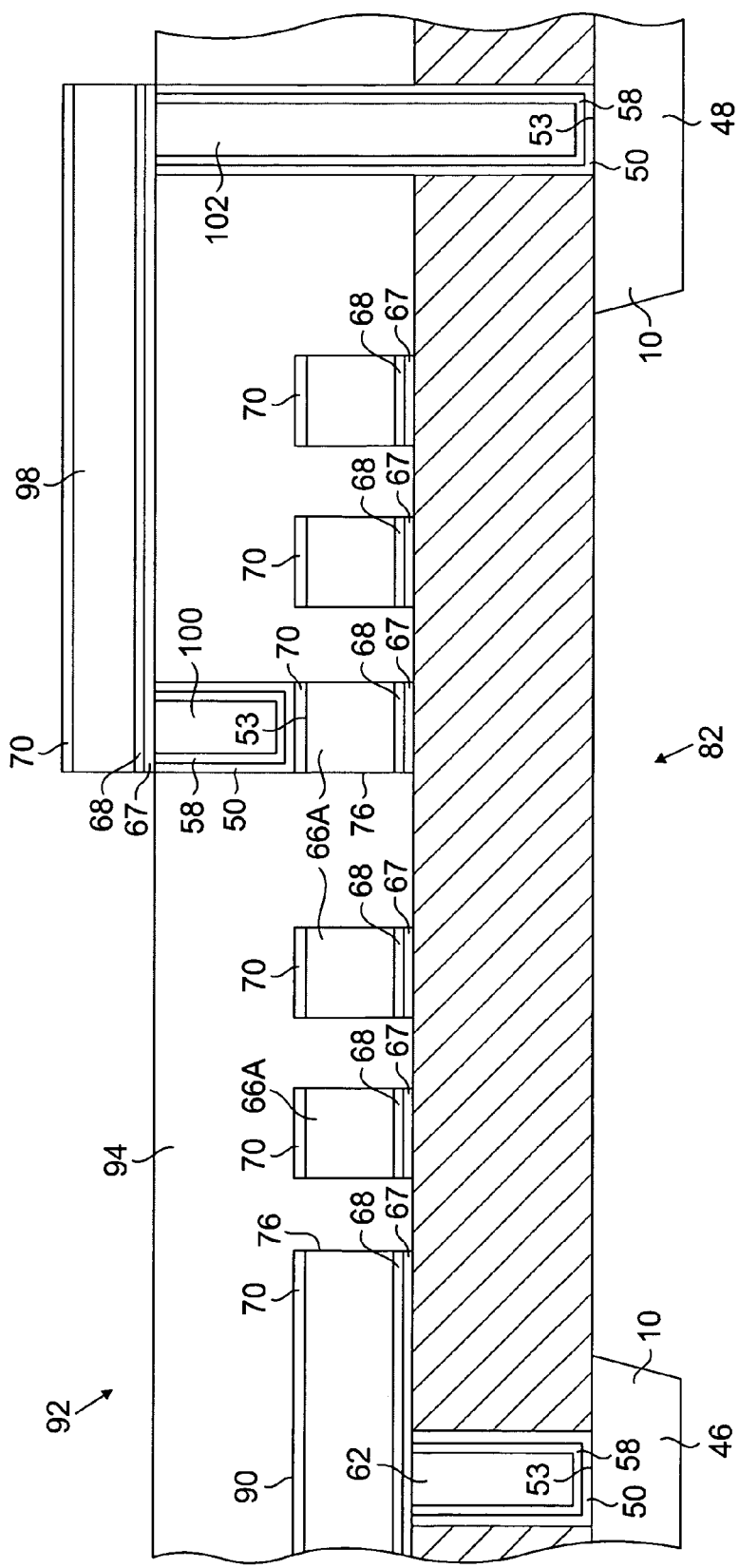

FIG. 13 is a cross-sectional view of an inductor 92, wherein both terminal ends 76 are spaced apart from the inductor 71 to allow the formation of a larger void 82 than present in the embodiments described heretofore. To form this embodiment an intermetallic dielectric layer 94 is disposed over the conductive lines 66A, and a second metallization layer overlying the intermetallic dielectric layer 94 comprises a conductive element 98 formed therein. A tungsten plug 100 connects the terminal end 76 to the conductive element 98. A tungsten plug 102 connects the conductive line 98 to an active region in the substrate 10. With both terminal ends 76 connected to an active region outside the footprint of the inductor 92, the void 82 can encompass substantially the entire region below the inductor 92.

As is known to those skilled in the art, an integrated circuit generally comprises a plurality of metallization layers for interconnecting device active regions formed within the semiconductor substrate. These layers are typically referred to with a numerical indicator preceded by the letter "M," for metallization, such as metallization layer one (M1). In one embodiment of the present invention an inductor is formed in an upper metallization layer (i.e., above M1), with upwardly and/or downwardly extending tungsten plugs for connecting inductor terminal ends to device active regions or other conductive structures.

Typically a fifth metallization layer (M5) is about 5 microns from the semiconductor substrate 10. An inductor formed therein is therefore about 5 microns from the substrate 10. It has been observed that removal of underlying substrate material (according to the teachings of the present invention) with a 5 micron separation between the inductor and the substrate improves the inductor Q. The known lossy substrate effects discussed above are observed up to an inductor-substrate separation distance equal to at least the diameter of the inductor. Typical inductor diameters may be in the range of 50–100 microns. Thus the teachings of the present invention may be advantageously employed where the inductor is formed in any of the metallization layers, since all the metallization layers are within 100 microns of the semiconductor substrate.

Figure 14:
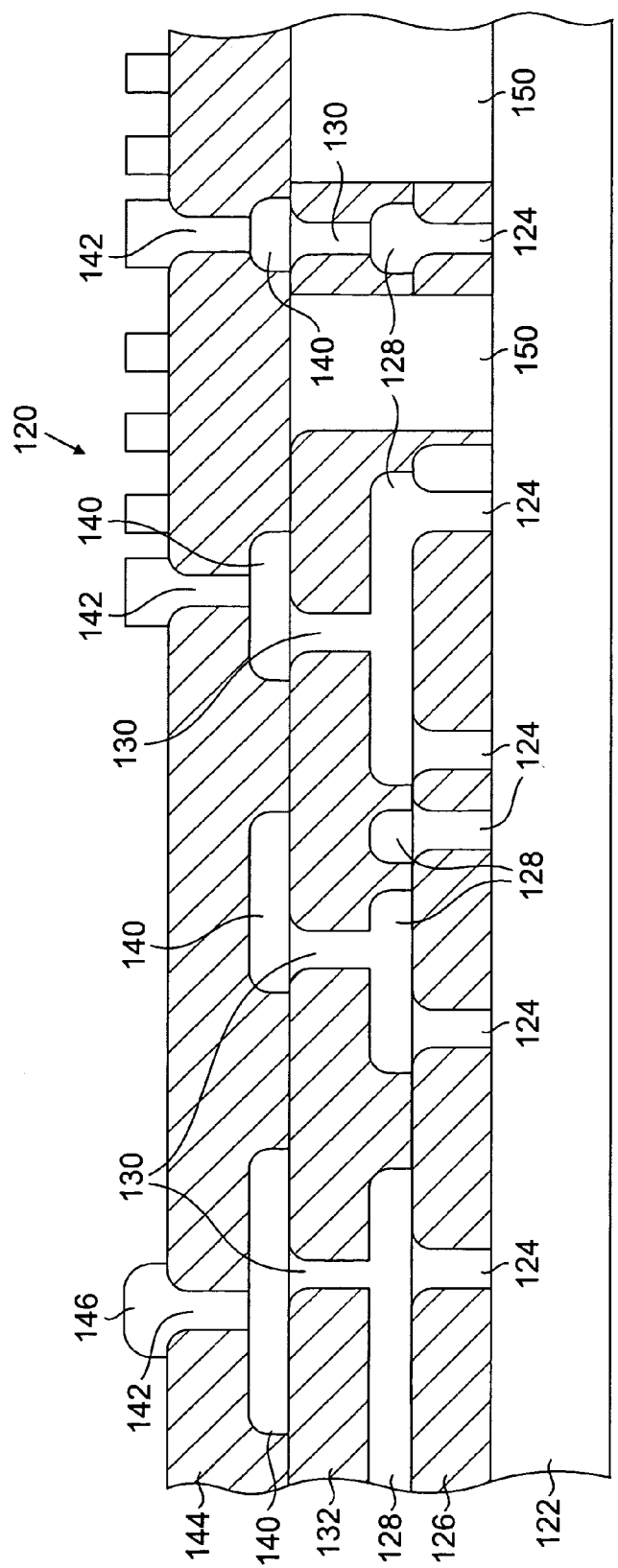

FIG. 14 is a cross-sectional view illustrating an embodiment of the present invention wherein an inductor 120 is formed in the third metallization layer or M3 of an integrated circuit device. FIG. 14 does not illustrate certain ancillary layers (e.g., titanium and titanium-nitride) shown in the embodiments above. A semiconductor substrate 122 comprises a plurality of active devices (not shown) formed according to known prior art techniques. Conductive vias 124 are formed in a dielectric layer 126. A first metallization layer (M1) comprises conductive structures 128 for interconnecting the conductive vias 124 to overlying conductive vias 130 formed in an intermetallic dielectric layer 132. As is known in the art, the conductive structures also extend into and outwardly from the plane of the FIG. 14 cross-section.

A second metallization layer (M2) comprises conductive structures 140 overlying the conductive vias 130 and connected to conductive vias 142 formed in an intermetallic dielectric layer 144. The third metallization layer comprises the inductor 120 and a conductive structure 146, which are formed simultaneously by known masking, patterning and etching steps performed on a conductive layer formed overlying the intermetallic dielectric later 144. Additional metallization layers and intermetallic dielectric layers (not shown in FIG. 14) can be formed over the illustrated structure.

Prior to formation of the intermetallic dielectric layer 144 are formed in regions 150, underlying the inductor 120, using conventional masking, patterning and etching steps. The voids are filled with silicon dioxide (a dielectric material) or another relatively low loss material prior to formation of the intermetallic dielectric layer 144 thereover. In another embodiment (not shown in FIG. 14) a region of the substrate 122 below the inductor 120 is also removed, according to the teachings above. As in the previous embodiment, the absence of semiconductor and metallization layers below the inductor 120 reduces eddy current loses and improves the inductor Q factor.

An architecture and process have been described as useful for forming an inductor on a semiconductor substrate. While specific applications of the invention have been illustrated, the principals disclosed herein provide a basis for practicing the invention in a variety of ways and in a variety of circuit structures. Numerous variations are possible within the scope of the invention. The invention is limited only by the claims that follow.

What is claimed is:

1. A semiconductor device comprising:
   a semiconductor substrate;
   a dielectric layer overlying the semiconductor substrate;
   a continuous conductor disposed on the dielectric layer;
   a tungsten plug extending from the continuous conductor to an active region of the semiconductor substrate; and
   wherein the semiconductor substrate defines a void a substrate region underlying the continuous conductor.

2. The semiconductor device of claim 1 further comprising substantially vertical first and second conductive vias in the dielectric layer, wherein the continuous conductor comprises first and second terminal ends, and wherein the semiconductor substrate comprises active regions, and wherein the first and the second conductive vias electrically connect an active region to the first and the second terminal ends, respectively.

3. The semiconductor device of claim 1 wherein a material of the continuous conductor comprises aluminum.

4. The semiconductor device of claim 1 wherein the continuous conductor comprises an inductor.

5. The semiconductor device of claim 1 wherein a size and a geometrical pattern of the continuous conductor provides a desired inductance value.

6. The semiconductor device of claim 1 wherein the continuous conductor comprises a spiral shape.

7. The semiconductor device of claim 2 wherein the substrate region is spaced apart from the active regions.

8. The semiconductor device of claim 1 further comprising a material disposed within the aperture selected from between a non-conductive and a non-semiconductive material.

9. The semiconductor device of claim 1 wherein the semiconductor substrate further comprises an upper substrate surface and a lower substrate surface, and wherein a lower surface of the dielectric layer contacts the upper substrate surface, and wherein the void extends from the upper substrate surface to the lower substrate surface in the region underlying the continuous conductor.

10. A semiconductor device comprising:
a semiconductor substrate; a plurality of active regions formed in the semiconductor substrate; a first dielectric layer overlying the semiconductor substrate; a plurality of conductive interconnect layers alternating with a plurality of dielectric layers for connecting to active regions, a continuous conductor formed in one of the plurality of conductive interconnect layers; and wherein the semiconductor substrate defines a first void therein in a region underlying the continuous conductor and a tungsten plug extending from the continuous conductor to one of the plurality of active regions.

11. The semiconductor device of claim 10 wherein at least one of the plurality of conductive interconnect layers and one of the plurality of dielectric layers underlying the continuous conductor defines a second void therein in a region underlying the continuous conductor, and wherein a material selected from between a non-conductive material and a non-semiconductive material is disposed within the second void.

12. The semiconductor device of claim 10 further comprising conductive vias, wherein the continuous conductor comprises first and second terminal ends, and wherein the conductive vias electrically connect each of the first and the second terminal ends to one of the plurality of active regions.

13. The semiconductor device of claim 10 further comprising conductive vias, wherein the continuous conductor comprises first and second terminal ends, and wherein the conductive vias electrically connect each of the first and the second terminal ends to one of the one or more conductive interconnect layers.

14. The semiconductor device of claim 10 further comprising first and second conductive vias, wherein the continuous conductor comprises first and second terminal ends, and wherein the first conductive via electrically connects the first terminal end to one of the plurality of active regions, and wherein the second conductive via electrically connects the second terminal end to one of the conductive interconnect layers.

15. The semiconductor device of claim 10 further comprising a material disposed within the aperture selected from between a non-conductive and a non-semiconductive material.

16. A semiconductor device comprising:
a semiconductor substrate having active regions formed therein;
a dielectric layer overlying the semiconductor substrate;
tungsten plugs formed in the dielectric layer extending between an upper surface of the dielectric layer and an active region;
conductive lines comprising an inductor formed overlying the upper surface and further comprising first and second terminal ends, wherein each of the first and the second terminal ends is in electrical communication with a tungsten plug; and
wherein the semiconductor substrate defines a void underlying at least a portion of the conductive lines.

17. The semiconductor device of claim 16 wherein a material disposed within the aperture is selected from between a dielectric material and a bonding material.

18. The semiconductor device of claim 16 wherein a material disposed within the aperture comprises one of a non-conductive material and a non-semiconductive material.

19. The semiconductor device of claim 16 wherein the semiconductor substrate further comprises an upper and a lower surface, and wherein the aperture extends from the upper to the lower surface underlying at least a portion of the conductive lines.

* * * * *